United States Patent
Sun et al.

(10) Patent No.: US 12,144,254 B2
(45) Date of Patent: Nov. 12, 2024

(54) DYNAMIC EQUIVALENT CIRCUIT OF COMBINED HEAT AND POWER SYSTEM, AND WORKING METHOD THEREOF

(71) Applicant: Shandong University, Jinan (CN)

(72) Inventors: Bo Sun, Jinan (CN); Jing Chen, Jinan (CN); Chenghui Zhang, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 0 days.

(21) Appl. No.: 17/697,257

(22) Filed: Mar. 17, 2022

(65) Prior Publication Data
US 2022/0359807 A1 Nov. 10, 2022

(30) Foreign Application Priority Data
Apr. 25, 2021 (CN) .......................... 202110448868.8

(51) Int. Cl.
| | |
|---|---|
| *F24H 9/20* | (2022.01) |
| *F24H 9/1818* | (2022.01) |
| *H10N 10/13* | (2023.01) |
| *H10N 10/17* | (2023.01) |
| *G06F 30/367* | (2020.01) |

(52) U.S. Cl.
CPC .......... *H10N 10/17* (2023.02); *F24H 9/1818* (2013.01); *F24H 9/2021* (2013.01); *H10N 10/13* (2023.02); *F24H 2250/02* (2013.01); *F24H 2250/04* (2013.01); *F24H 2250/08* (2013.01)

(58) Field of Classification Search
None
See application file for complete search history.

(56) References Cited

U.S. PATENT DOCUMENTS

| | | | | |
|---|---|---|---|---|
| 5,379,231 | A * | 1/1995 | Pillage | G06F 30/367 |
| | | | | 716/136 |
| 9,910,945 | B2 * | 3/2018 | Fang | G06F 30/367 |
| 2003/0046045 | A1 * | 3/2003 | Pileggi | G06F 30/367 |
| | | | | 703/4 |
| 2003/0069722 | A1 * | 4/2003 | Beattie | G06F 30/367 |
| | | | | 703/14 |
| 2010/0291452 | A1 * | 11/2010 | Imanishi | H01M 8/0488 |
| | | | | 429/432 |
| 2011/0213606 | A1 * | 9/2011 | Seaman | H02J 3/00 |
| | | | | 703/18 |
| 2012/0022713 | A1 * | 1/2012 | Deaver, Sr. | G05B 17/02 |
| | | | | 700/298 |

(Continued)

*Primary Examiner* — Thor S Campbell
(74) *Attorney, Agent, or Firm* — Tutunjian & Bitetto, P.C.

(57) ABSTRACT

The present disclosure discloses a dynamic equivalent circuit of a combined heat and power system, and a working method thereof. Controlled sources are used to represent a thermoelectric coupling source; equivalent inductance is used to represent a delay of a heat transmission pipeline; equivalent resistance is used to represent a heat load and a heat loss of the heat transmission pipeline; and equivalent capacitance is used to represent a heat storage water tank. A circuit model is used to uniformly represent two thermoelectric heterogeneous energy sources, and a single power simulation tool may be used to simulate a combined heat and power system, so that the simulation system has a simple structure and is easy to develop and maintain.

11 Claims, 6 Drawing Sheets

(56) References Cited

U.S. PATENT DOCUMENTS

| | | | |
|---|---|---|---|
| 2012/0150497 A1* | 6/2012 | Sun | H02J 3/00 |
| | | | 703/2 |
| 2013/0226482 A1* | 8/2013 | Sun | H02J 3/26 |
| | | | 702/60 |
| 2015/0112498 A1* | 4/2015 | Patel | G05F 1/66 |
| | | | 700/291 |
| 2017/0184640 A1* | 6/2017 | Pileggi | H02J 3/06 |
| 2018/0019699 A1* | 1/2018 | Zaimeddine | H02P 29/50 |
| 2018/0158152 A1* | 6/2018 | Jereminov | H02J 3/16 |
| 2019/0296548 A1* | 9/2019 | Patel | G05B 13/041 |
| 2023/0048762 A1* | 2/2023 | Aksamija | E04B 1/7654 |

\* cited by examiner

DYNAMIC EQUIVALENT CIRCUIT OF COMBINED HEAT AND POWER SYSTEM, AND WORKING METHOD THEREOF

CROSS REFERENCE TO RELATED APPLICATION(S)

This patent application claims the benefit and priority of Chinese Patent Application No. 202110448868.8, filed on Apr. 25, 2021, the disclosure of which is incorporated by reference herein in its entirety as part of the present application.

TECHNICAL FIELD

The present disclosure relates to the field of a combined heat and power simulation technology, and particularly relates to a dynamic equivalent circuit of a combined heat and power system, and a working method thereof.

BACKGROUND ART

The statements in this section merely mention the background art related to the present disclosure, and do not necessarily constitute the prior art.

The combined heat and power system has attracted wide attention from governments and enterprises all over the world for its advantages such as high primary energy utilization efficiency and safe and reliable energy supply. Electric heating belongs to a heterogeneous energy source, its physical characteristics and disciplines are very different, and representation manners and research methods are not unified. An existing simulation system uses multiple types of energy simulation software to co-simulate multi-energy systems, such as a combined heat and power system, by means of data communication. As a result, the simulation system has the disadvantages of complex structure, inconvenient maintenance, data delay and limited interface development caused by the relative independence of each simulation software program. Therefore, there is an urgent need for unified representation modeling and simulation research of thermoelectric heterogeneous energy sources. Furthermore, the combined heat and power system includes multiple energy links such as energy conversion, transmission, dissipation and storage, where due to its own heat capacity and other reasons, a temperature of a building heat load changes slowly; and due to a long-distance heat transmission pipeline, dynamic characteristics such as transmission delay and heat dissipation in the pipeline are obvious and cannot be ignored. However, in a simulation system with "electricity" as a core, device models such as heat and gas are added to power analysis tools, and the models are simple and cannot reflect a dynamic process of a thermal system.

SUMMARY

In order to solve the defects of the prior art, the present disclosure provides a dynamic equivalent circuit of a combined heat and power system, and a working method thereof.

In the first aspect, the present disclosure provides a dynamic equivalent circuit of a combined heat and power system.

The dynamic equivalent circuit of a combined heat and power system includes:

controlled sources are used to represent a thermoelectric coupling source: equivalent inductance is used to represent a delay of a heat transmission pipeline: equivalent resistance is used to represent a heat load and a heat loss of the heat transmission pipeline; and equivalent capacitance is used to represent a heat storage water tank.

In the second aspect, the present disclosure provides a working method of a dynamic equivalent circuit of a combined heat and power system.

A simulation method of the dynamic equivalent circuit of the combined heat and power system includes:

controlled sources are used to represent a thermoelectric coupling source: equivalent inductance is used to represent a delay of a heat transmission pipeline: equivalent resistance is used to represent a heat load and a heat loss of the heat transmission pipeline; and equivalent capacitance is used to represent a heat storage water tank.

When an electrical load is $R_e$, a supply voltage of the thermoelectric coupling source is $U_e$.

The heat flows out of a waste heat recovery system of the thermoelectric coupling source; and the heat flows through a heating pipeline after a transmission delay time, and a heat loss is generated.

If a first switch and a second switch are all turned on, the heat is completely used for heating of a heat load, and the heat completely flows through the heat load to heat the heat load and then passes through a water return pipeline to reach a water return side.

If the first switch and the second switch are turned off at the same time, part of the heat flows through the heat load to heat the heat load and then passes through the water return pipeline to reach the water return side, and the other part of the heat flows into the heat storage water tank and is stored for later use.

Compared with the prior art, the present disclosure has the following beneficial effects:

A circuit model is used to uniformly represent two thermoelectric heterogeneous energy sources, and a single power simulation tool may be used to simulate a combined heat and power system, so that the simulation system has a simple structure and is easy to develop and maintain, and simulation errors caused by data communications of multiple energy software are avoided. By considering the dynamic characteristics of a thermal subsystem, the accuracy of the simulation system is improved.

An established dynamic equivalent circuit model may be used for analysis of dynamic characteristics of the combined heat and power system, design of control algorithms, and testing of algorithms such as optimization design. In addition, an equivalent circuit may also be simplified according to the knowledge of electrodynamics, thereby reducing the model complexity, and protecting the detailed parameter information of the system.

The advantages of the additional aspects of the present disclosure will be partially given in the following description, and parts will become obvious from the following description, or be understood through the practice of the present disclosure.

BRIEF DESCRIPTION OF THE DRAWINGS

The accompanying drawings which constitute a part of the description of the present disclosure are intended to provide further understanding of the present disclosure. The exemplary examples of the present disclosure and descriptions thereof are intended to explain the present disclosure and do not constitute an inappropriate limitation to the present disclosure.

DETAILED DESCRIPTION OF THE EMBODIMENTS

It should be pointed out that the following detailed description is illustrative and is intended to provide further explanation of the present disclosure. Unless otherwise specified, all technical and scientific terms used herein have the same meanings as those generally understood by those of ordinary skill in the art to which the present disclosure pertains.

It should be noted that the terms used herein are merely used for describing the specific implementations, but are not intended to limit exemplary implementations of the present disclosure. As used herein, unless the context clearly indicates otherwise, the singular forms are intended to include the plural forms as well. Moreover, it should be understood that the terms "include", "have" and any other variants mean to cover a non-exclusive inclusion, for example, a process, method, system, product, or device that includes a list of steps or units is not necessarily limited to those expressly listed steps or units, but may include other steps or units not expressly listed or inherent to such a process, method, system, product, or device.

In addition, the embodiments in the present disclosure and the features in the embodiments can be combined with each other in a non-conflicting situation.

Embodiment 1

This embodiment provides a dynamic equivalent circuit of a combined heat and power system.

Figure 1:
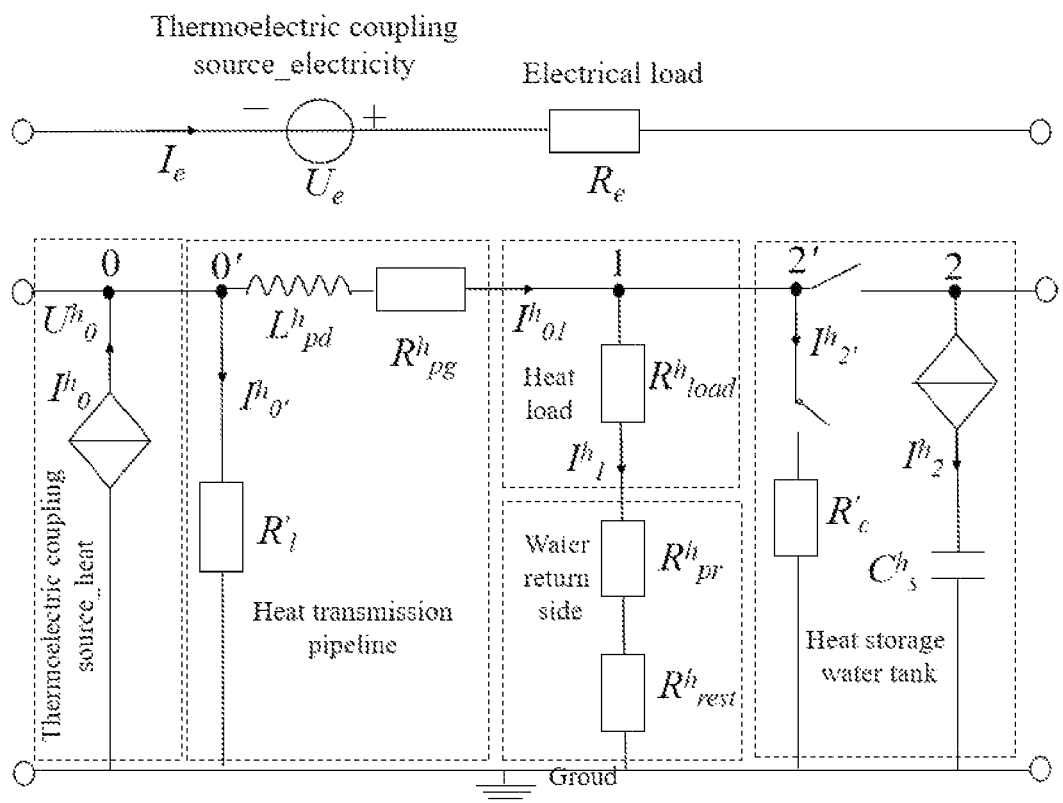
FIG. 1 shows a simulation system of a dynamic equivalent circuit in a first embodiment.

As shown in FIG. 1, the dynamic equivalent circuit of the combined heat and power system includes:
controlled sources are used to represent a thermoelectric coupling source: equivalent inductance is used to represent a delay of a heat transmission pipeline: equivalent resistance is used to represent a heat load and a heat loss of the heat transmission pipeline; and equivalent capacitance is used to represent a heat storage water tank.

Further, the circuit includes: a first branch and a second branch,
where the first branch includes: an input terminal, a controlled voltage source $U_e$, a resistor $R_e$ and an output terminal connected in sequence;
the second branch includes: an input terminal, a controlled current source $I_0^h$ and a ground terminal connected in sequence; and
the first branch and the second branch are used to represent the thermoelectric coupling source of the combined heat and power system.

Exemplarily, the thermoelectric coupling source refers to a device that can convert a certain energy into electrical energy and thermal energy at the same time, such as a gas turbine that can convert the chemical energy of fuel gas into electrical energy and thermal energy at the same time, and a fuel cell that can convert the chemical energy of hydrogen into electrical energy and thermal energy at the same time.

Figure 5A:
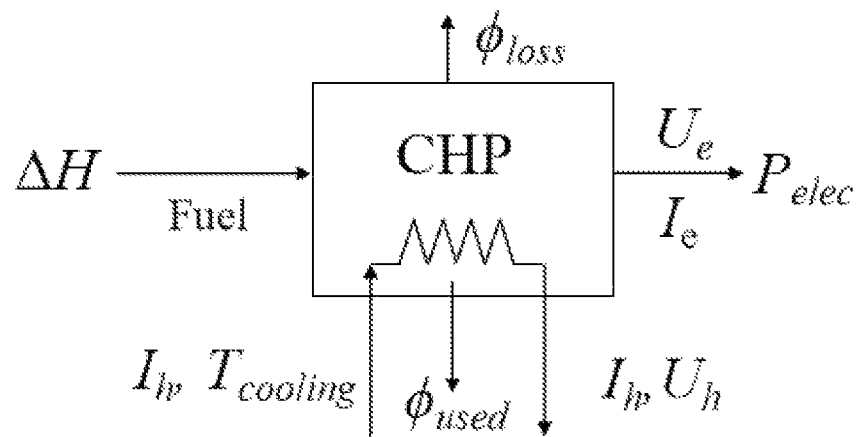
FIG. 5(a) shows a thermoelectric coupling source device.
Figure 5B:
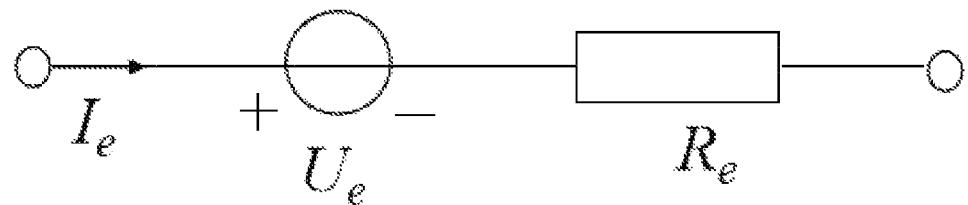
FIG. 5(b) shows an equivalent circuit representation of the thermoelectric coupling source device.
Figure 5C:
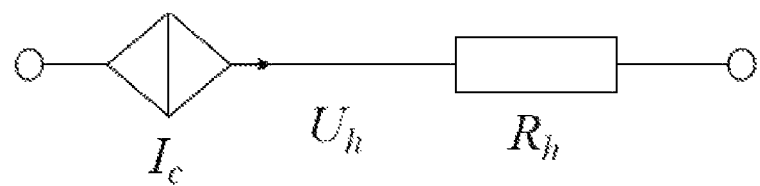
FIG. 5(c) shows an equivalent circuit representation of the thermoelectric coupling source device.

Exemplarily, the thermoelectric coupling source: a controlled source of a circuit element is used to represent a generator set of a combined heat and power system, such as a gas generator set and a fuel cell. Taking the gas generator set as an object, an energy balance equation is shown in Formula (10), and an outlet temperature $U_h$ and a current $I_e$ of cooling water may be derived as Formula (11). FIG. 5(a) shows a thermoelectric coupling source device. FIG. 5(b) shows an equivalent circuit representation of the thermoelectric coupling source device. FIG. 5(c) shows an equivalent circuit representation of the thermoelectric coupling source device.

Further, a mathematical model of the thermoelectric coupling source of the combined heat and power system is:

$$U_h I_h = \frac{\eta_h U_e I_e}{\eta_e} + T_{cooling} I_h, \tag{10}$$

where $U_h$ represents an outlet temperature of cooling water; $I_h$ represents a heat capacity flow rate of the cooling water; $\eta_e$ represents a generating efficiency of a thermoelectric coupling source: $U_e$ represents an output voltage of a thermoelectric coupling source: $I_e$ represents an output current of the thermoelectric coupling source: $T_{cooling}$ represents an inlet temperature of the cooling water; and $\eta_h$ represents a thermal efficiency of the thermoelectric coupling source.

Further, the circuit further includes: a third branch and a fourth branch,
where the third branch is connected in parallel with the second branch; the third branch includes: an input terminal, a virtual resistor $R'_l$ and a ground terminal connected in sequence;
the fourth branch includes: an input terminal, an inductor $L_{pd}^h$, a resistor $R_{pd}^h$ and an output terminal connected in sequence;
the third branch and the fourth branch are used to represent the heat transmission pipeline of the combined heat and power system; and
the inductor $L_{pd}^h$ is used to represent a delay of the heat transmission pipeline.

Exemplarily, a delay phenomenon of heat transmission in the heat transmission pipeline may be described by thermal inductance, which is similar to a hindering effect of an inductance element on a current in a circuit. Due to model requirements of optimization control of the combined heat and power system, time constant characteristics of thermal inductance are mainly researched. Combined with a circuit logic, a virtual resistor $R'_l$ is designed and connected in parallel with $L_{pd}^h$ to form an RL circuit structure, but it has no actual physical meaning. A value of $R'_l$ needs to be so large that its shunting effect is small enough to be ignored.

According to the knowledge of electronics, it is believed that after $5\tau_l$ ($\tau_l$ is an inductance time constant), an inductance current is stable. Therefore, assuming that a transmission delay time of heat flow is $t_{delay}$, $L_h$ is expressed as:

$$L_h = R'_l \tau_l = \frac{R'_l t_{delay}}{5}. \quad (5)$$

Generally, while there is a delay in pipeline heat transmission, the heat dissipation through a pipeline to an ambient environment is also inevitable, that is, there is equivalent resistance.

Further, a mathematical model of the heat loss of the heat transmission pipeline of the combined heat and power system is:

The resistance $R^h_{pipe}$ of the heat transmission pipeline is expressed as:

$$R^h_{pipe} = \frac{(T_{start} - T_a)\left(1 - e^{\frac{-\lambda L}{Cp}}\right)}{Cp}, \quad (6)$$

where $T_{start}$ represents an inlet temperature of the heat transmission pipeline, $T_a$ represents an environmental temperature of the heat transmission pipeline, $\lambda$ represents a heat dissipation coefficient of the pipeline, L represents a length of the pipeline, and Cp represents a heat capacity flow rate of heat flow in the pipeline.

Figure 3A:
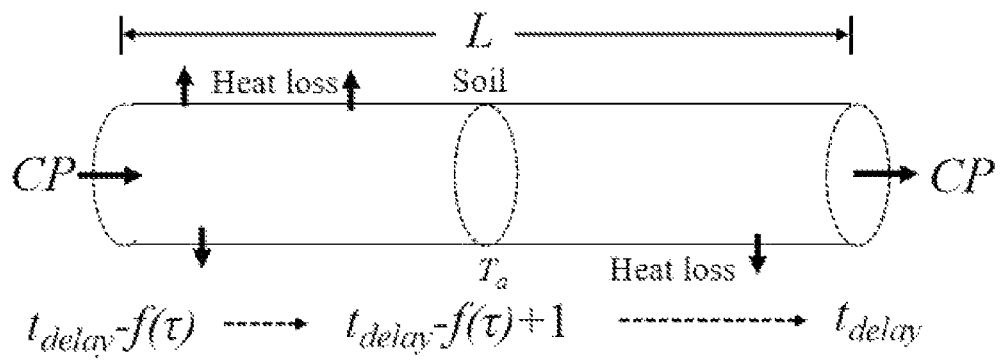
FIG. 3(a) shows a heat transmission pipeline.
Figure 3B:
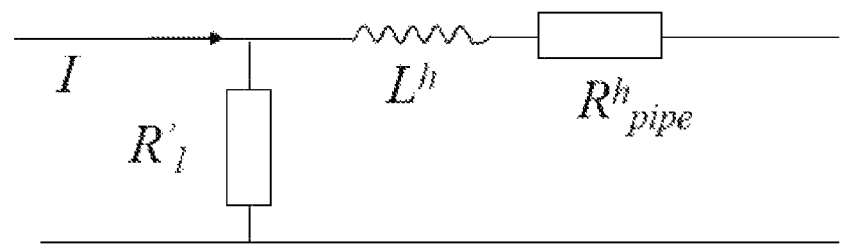
FIG. 3(b) shows an equivalent circuit representation of the heat transmission pipeline.

In conclusion, the heat transmission pipeline is shown in FIG. 3(a), and the equivalent circuit representation of the heat transmission pipeline is shown in FIG. 3(b).

Further, the circuit further includes: a fifth branch.

The fifth branch includes: a resistor $R_{load}^h$, a resistor $R_{pr}^h$, a resistor $R_{rest}^h$ and a ground terminal connected in sequence, where the resistor $R_{load}^h$ is also connected with an output terminal of the resistor $R_{pg}^h$, where the resistor $R_{load}^h$ represents a heat load of the combined heat and power system, the resistors $R_{pr}^h$ and $R_{rest}^h$ represent a water return side of the combined heat and power system, and the resistors $R_{pg}^h$ and $R_{pr}^h$ are used to represent the heat loss of the heat transmission pipeline.

Exemplarily, heat load: all devices having heat dissipation in the combined heat and power system may be called heat loads, such as building heat loads and heat transmission pipelines with heat losses. Here, the heat load is compared to a resistor, and then an equivalent representation form of dynamic resistance $R^h$ is established.

Further, a mathematical model of the heat load of the combined heat and power system is:

due to the existence of its own heat capacity b, the heat load is heated to a temperature $T_e$ by the heat flow at a heat exchange rate a, and a dynamic process of $T_e$ temperature rise may be expressed as Formula (1):

$$\overset{\square}{T_e}(t) = \frac{a}{b}(T_{in}(t) - T_e(t)), \quad (1)$$

where $T_{in}(t)$ represents an inlet temperature, $T_e(t)$ represents a heat load temperature at a time t, and $\overset{\square}{T_e}(t)$ represents a change rate of the heat load temperature at the time t.

At the time t, the heat capacity flow rate of the heat flow is Cp(t), a temperature is $T_{in}(t)$, a heat dissipation rate of the heat load is $\phi_{load}(t)$, and an outlet temperature $T_{out}(t)$ of the heat flowing through the heat load is expressed as:

$$T_{out}(t) = T_{in}(t) - \frac{\overset{\square}{T_e}(t) \cdot b + \phi_{load}(t)}{Cp(t)}. \quad (2)$$

At this time, equivalent resistance $R^h(t)$ of the heat load may be expressed as:

$$R^h(t) = \frac{T_{in}(t) - T_{out}(t)}{Cp(t)} = \frac{\overset{\square}{T_e}(t)b + \phi_{load}}{[Cp(t)]^2}. \quad (3)$$

Further, a mathematical model of the water return side of the combined heat and power system is:

$$R^h_{rest} = \frac{T_{in}(t)}{Cp(t)} - R^h. \quad (4)$$

In order to solve the contradiction that voltages of parallel circuits are equal but outlet temperatures of the parallel circuits are not necessarily equal, a model $R^h_{rest}$ on the water return side of the resistor is established, so as to represent the low-grade heat energy of the water return side of the resistor.

Figure 2A:
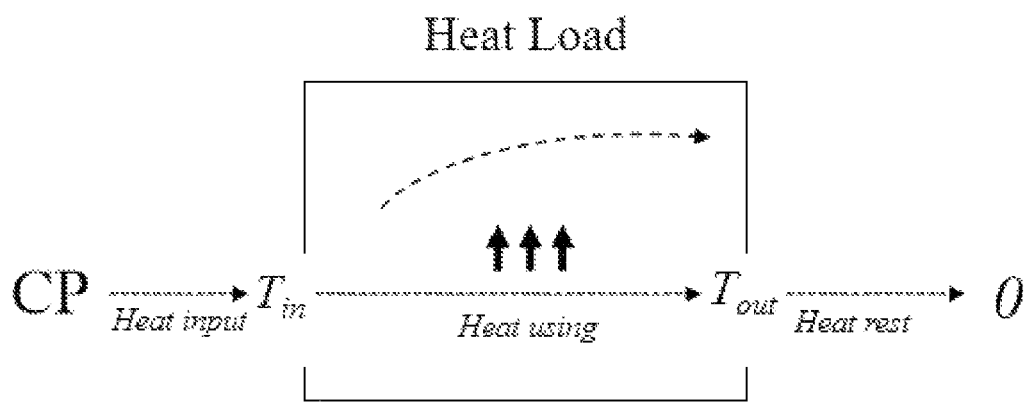
FIG. 2(a) shows a heat load.
Figure 2B:
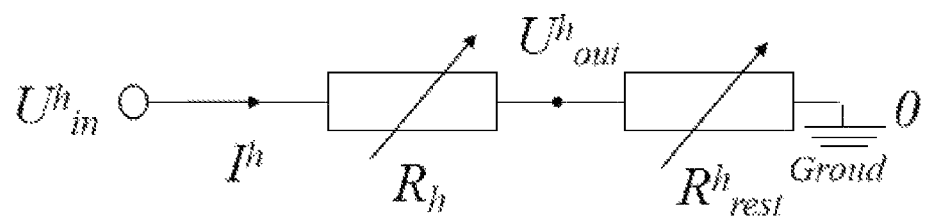
FIG. 2(b) shows an equivalent circuit representation of the heat load.

In conclusion, the heat load is shown in FIG. 2(a), and the equivalent circuit representation form of the heat load is shown in FIG. 2(b).

Further, the dynamic equivalent circuit of the combined heat and power system includes: a sixth branch and a seventh branch, where the sixth branch includes: a first switch, one end of the first switch is connected with an output terminal of the resistor $R_{pg}^h$ through a node 2', and the other end of the first switch is grounded through a resistor $R'_c$;

the seventh branch includes: a controlled current source $I_2^h$, one end of the controlled current source $I_2^h$ is connected with the output terminal, the other end of the controlled current source $I_2^h$ is grounded through a capacitor $C_s^h$, assuming that a connecting point between the controlled current source $I_2^h$ and the output terminal is a node 2, and a second switch is arranged between the node 2' and the node 2; and the sixth branch and the seventh branch are used to represent the heat storage water tank of the combined heat and power system.

Exemplarily, heat storage water tank: since the existence of heat storage allows a mismatch between a heat demand and heat generation, the combination of heat storage and combined heat and power systems has become a standard scheme.

Further, a mathematical model of the heat storage water tank of the combined heat and power system is:

similar to a capacitance element C, a heat capacity $C^h(t)$ represents the heat storage at the time t.

Based on thermoelectric comparison rules, calculation formulas of $C^h(t)$ and total heat storage $W_c^h(t)$ at the time t are respectively:

$$C^h(t) = \frac{\int_0^t Cp_{in}(t)dt}{T_{tank}}, \quad (7)$$

-continued $$W_c^h(t) = C_h(t)[T_{tank}(t)]^2, \quad (8)$$

where $Cp_{in}(t)$ represents a heat capacity flow rate at an inlet of the water tank, and $T_{tank}(t)$ represents a heat storage water temperature at the time t. $T_{tank}(t)$ is represented by Formula (9) without considering the heat dissipation of the water tank:

$$T_{tank}(t) = \frac{\int_0^t V_{in}(t) T_{in}(t) dt}{\int_0^t V_{in}(t) dt}, \quad (9)$$

where $T_{in}(t)$ and $V_{in}(t)$ respectively represent an inlet temperature and an inlet flow rate of the heat storage water tank at the time t.

Figure 4A:
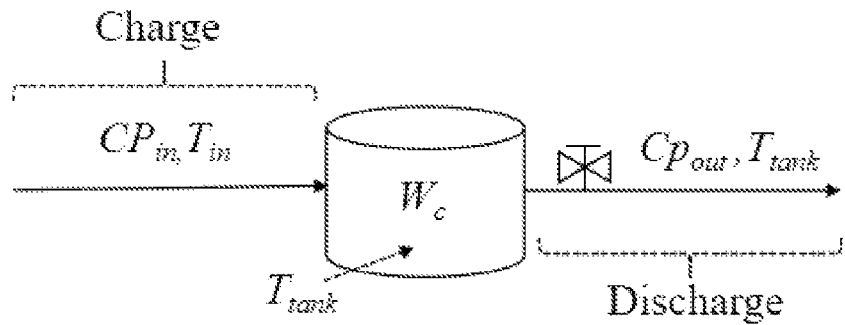
FIG. 4(a) shows a heat storage water tank.
Figure 4B:
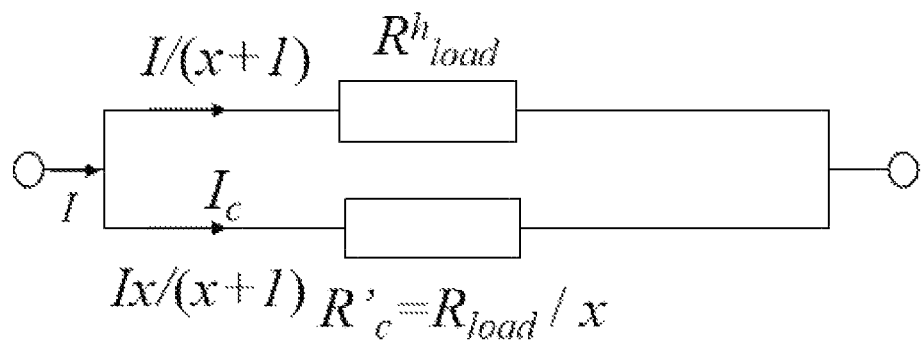
FIG. 4(b) shows an equivalent circuit representation of the heat storage water tank.
Figure 4C:
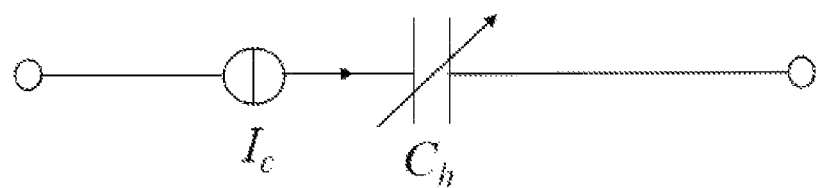
FIG. 4(c) shows an equivalent circuit representation of the heat storage water tank.

Similar to thermal inductance, $C_h$ also needs a virtual resistor $R'_c$, which is connected in parallel with a heat load branch, its value is 1/x times the total resistance value of the heat load branch, and its function is to share $$\frac{x}{1+x}$$

times of the total current together with the heat load branch, and assign the current to a current source Ic. Specifically, FIG. 4(a) shows a heat storage water tank; FIG. 4(b) shows an equivalent circuit representation of the heat storage water tank; and FIG. 4(c) shows an equivalent circuit representation of the heat storage water tank.

In the present disclosure, a simulation model of a dynamic equivalent circuit of a combined heat and power system, including four typical links of a thermoelectric coupling source, a heat transmission pipeline, a heat load and heat storage, will be established.

First, according to thermoelectric comparison rules, a heat dissipation process of the heat load including a building heat load and a pipeline heat load (pipeline heat energy loss), in the system is compared to a resistance element:
- a heat transmission delay is compared to a thermal inductance element;
- non-phase change heat storage, which is usually a heat storage water tank, is compared to a heat capacity element; and
- a thermoelectric coupling source, which is usually a gas generator set, a fuel cell, etc., is represented in a form of a controlled source. Finally, in combination with a system structure, a model of the dynamic equivalent circuit of the combined heat and power system is constructed, and unified dynamic simulation of the heterogeneous energy flow of the system is realized.

Figure 6:
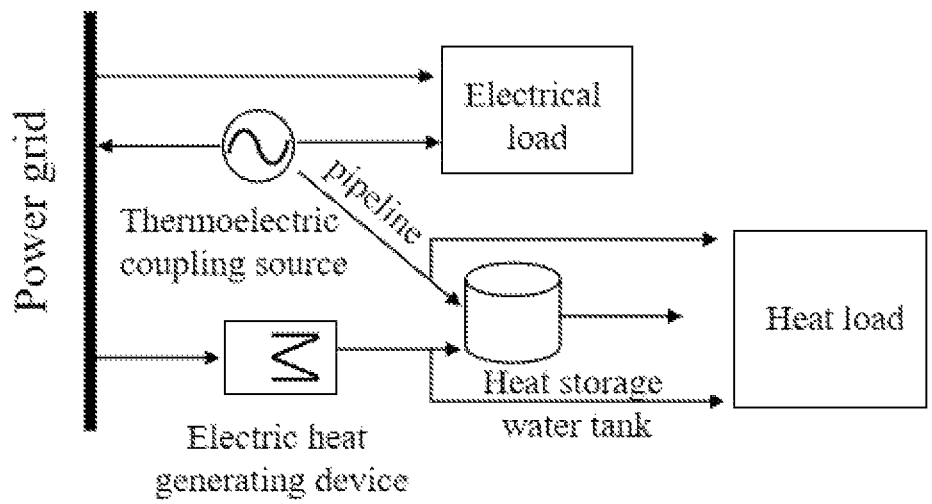
FIG. 6 shows a structural diagram of a combined heat and power system.

In combination with a structural diagram of the combined heat and power system in FIG. 6, a complete simulation model of the equivalent circuit of the combined heat and power system, including a thermoelectric coupling source, a heat transmission pipeline, a heat load and a heat storage water tank, is shown in FIG. 1, where a controlled source CCCS indicates that when an outlet temperature $U^h_0$ of cooling water and an output voltage $U_e$ of a gas generator set are constant, the a flow rate $I^h_0$ of the cooling water is controlled by a current $I_e$.

A node 0' is a branch node of an auxiliary resistor $R'_l$, which has no physical meaning, and since $R'_l$ is large enough, $\Gamma_{0'}$ may be approximately regarded as 0.

$L_{pd}^h$ represents a heat transmission delay, $R_{pg}^h$ and $R_{pr}^h$ on the water return side respectively represent heat dissipation of a heat transmission pipeline for heating and a heat transmission pipeline for water return, $R_{rest}^h$ represents residual resistance, and $R_{rest}^h$ represents lower-grade return water heat energy after passing through the heat load. $\Gamma_2$ is equal to $\Gamma_{2'}$, and $\Gamma_2$ represents an inlet flow rate of a heat storage water tank $C_h^s$. The simulation model may be flexibly arranged on power simulation software. A Simscope tool of an MATLAB/Simulink has been used to realize the simulation of the combined heat and power system, and simulation results verify that the simulation model is effective.

Embodiment 2

This embodiment provides a simulation method of a dynamic equivalent circuit of a combined heat and power system.

The simulation method of the dynamic equivalent circuit of the combined heat and power system includes:
controlled sources are used to represent a thermoelectric coupling source: equivalent inductance is used to represent a delay of a heat transmission pipeline: equivalent resistance is used to represent a heat load and a heat loss of the heat transmission pipeline; and equivalent capacitance is used to represent a heat storage water tank.

When an electrical load is $R_e$, a supply voltage of a thermoelectric coupling source is $U_e$.

The heat flows out of a waste heat recovery system of the thermoelectric coupling source; and the heat flows through a heating pipeline after a transmission delay time, and a heat loss is generated.

If a first switch and a second switch are all turned on, the heat is completely used for heating of a heat load, and the heat completely flows through the heat load to heat the heat load and then passes through a water return pipeline to reach a water return side.

If the first switch and the second switch are turned off at the same time, part of the heat flows through the heat load to heat the heat load and then passes through the water return pipeline to reach the water return side, and the other part of the heat flows into a heat storage water tank and is stored for later use.

The above description is merely preferred examples of the present disclosure and is not intended to limit the present disclosure, and various changes and modifications of the present disclosure may be made by those skilled in the art. Any modifications, equivalent substitutions, improvements, and the like made within the spirit and principle of the present disclosure shall be included within the protection scope of the present disclosure.

What is claimed is:

1. A simulation method of a combined heat and power system, comprising:
building a dynamic equivalent circuit for the combined heat and power system, comprising: a controlled source used to represent a thermoelectric coupling source, equivalent inductance used to represent a delay of a heat transmission pipeline, equivalent resistance used to represent a heat load and a heat loss of the heat transmission pipeline, and equivalent capacitance used to represent a heat storage water tank;

performing a setting step, configured for setting parameters of the controlled source, the equivalent inductance, equivalent resistance and the equivalent capacitance are set to a predetermined value set based on designed physical parameter values of the combined heat and power system;

running the dynamic equivalent circuit;

obtaining voltage values and current values at a plurality of nodes of the dynamic equivalent circuit;

adjusting the designed physical parameter values based on the obtained voltage values and current values at the plurality of nodes; and proceeding to the setting step for repeating, until the obtained voltage values and current values at the plurality of nodes meet a predetermined condition, so as to obtain final physical parameter values, wherein a target combined heat and power system is established based on the final physical parameter values.

2. The simulation method according to claim 1, wherein the circuit comprises a first branch and a second branch, wherein the first branch comprises: an input terminal, a controlled voltage source $U_e$, a resistor $R_e$ and an output terminal connected in sequence;

the second branch comprises: an input terminal, a controlled current source $I_0^h$ and a ground terminal connected in sequence; and the first branch and the second branch are used to represent the thermoelectric coupling source of the combined heat and power system.

3. The simulation method according to claim 2, wherein the circuit further comprises: a third branch and a fourth branch, wherein the third branch is connected in parallel with the second branch; the third branch comprises: an input terminal, a virtual resistor $R'_l$ and a ground terminal connected in sequence;

the fourth branch comprises: an input terminal, an inductor $L_{pd}^h$, a resistor $R_{pg}^h$ and an output terminal connected in sequence; and the third branch and the fourth branch are used to represent the heat transmission pipeline of the combined heat and power system.

4. The simulation method according to claim 1, wherein the circuit further comprises: a fifth branch;

the fifth branch comprises: a resistor $R_{load}^h$, a resistor $R_{pr}^h$, a resistor $R_{rest}^h$, and a ground terminal connected in sequence, wherein the resistor $R_{load}^h$ is also connected with an output terminal of the resistor $R_{pg}^h$; and the resistor $R_{load}^h$ represents a heat load of the combined heat and power system, and the resistors $R_{pr}^h$ and $R_{rest}^h$ represent a water return side of the combined heat and power system.

5. The simulation method according to claim 1, wherein the circuit further comprises: a sixth branch and a seventh branch, wherein the sixth branch comprises: a first switch, one end of the first switch is connected with the output terminal of the resistor $R_{pg}^h$ through a node 2', and the other end of the first switch is grounded through a resistor $R'_c$;

the seventh branch comprises: a controlled current source $I_2^h$, one end of the controlled current source $I_2^h$ is connected with the output terminal, the other end of the controlled current source $I_2^h$ is grounded through a capacitor $C_s^h$, assuming that a connecting point between the controlled current source $I_2^h$ and the output terminal is a node 2, and a second switch is arranged between the node 2' and the node 2; and the sixth branch and the seventh branch are used to represent the heat storage water tank of the combined heat and power system.

6. The simulation method according to claim 1, wherein a mathematical model of the thermoelectric coupling source of the combined heat and power system is:

$$U_h I_h = \frac{\eta_h U_e I_e}{\eta_e} + T_{cooling} I_h,$$

wherein $U_h$ represents an outlet temperature of cooling water; $I_h$ represents a heat capacity flow rate of the cooling water; $\eta_e$ represents a generating efficiency of the thermoelectric coupling source; $U_e$ represents an output voltage of the thermoelectric coupling source; $I_e$ represents an output current of the thermoelectric coupling source; $T_{cooling}$ represents an inlet temperature of the cooling water; and $\eta_h$ represents a thermal efficiency of the thermoelectric coupling source.

7. The simulation method according to claim 1, wherein a mathematical model of the heat loss of the heat transmission pipeline of the combined heat and power system is:

$$R_{pipe}^h = \frac{(T_{start} - T_a)\left(1 - e^{\frac{-\lambda L}{Cp}}\right)}{Cp},$$

wherein $R_{pipe}^h$ represents resistance of the heat transmission pipeline, $T_{start}$ represents an inlet temperature of the heat transmission pipeline, $T_a$ represents an environmental temperature of the heat transmission pipeline, $\lambda$ represents a heat dissipation coefficient of the pipeline, L represents a length of the pipeline, and Cp represents a heat capacity flow rate of heat flow.

8. The simulation method according to claim 1, wherein a mathematical model of the heat load of the combined heat and power system is:

due to the existence of its own heat capacity b, the heat load is heated to a temperature $T_e$ by the heat flow at a heat exchange rate a, and a dynamic process of $T_e$ temperature rise is expressed as:

$$\dot{T_e}(t) = \frac{a}{b}(T_{in}(t) - T_e(t)),$$

wherein $T_{in}(t)$ represents an inlet temperature, $T_e(t)$ represents a heat load temperature at a time t, and $\dot{T_e}(t)$ represents a change rate of the heat load temperature at the time t;

when the heat capacity flow rate of the heat flow is $Cp(t)$ and a heat dissipation rate of the heat load is $\phi_{load}$, an outlet temperature $T_{out}(t)$ of the heat flowing through the heat load is expressed as:

$$T_{out}(t) = T_{in}(t) - \frac{\dot{T_e}(t) \cdot b + \phi_{load}}{Cp(t)};$$

then, equivalent resistance $R^h(t)$ of the heat load expressed as:

$$R^h(t) = \frac{T_{in}(t) - T_{out}(t)}{Cp(t)} = \frac{T_e(t)b + \dot{\phi}_{load}}{[Cp(t)]^2};$$

and a mathematical model of the water return side of the combined heat and power system is:

$$R^h_{rest} = \frac{T_{in}(t)}{Cp(t)} - R^h.$$

9. The simulation method according to claim 1, wherein a mathematical model of the heat storage water tank of the combined heat and power system is:

based on thermoelectric comparison rules, calculation formulas of heat storage $C^h(t)$ and total heat storage $W_c^h$ are respectively:

$$C^h(t) = \frac{\int_0^t Cp_{in}(t)dt}{T_{tank}},$$

$$W_c^h = C_h T_{tank}^2,$$

wherein $CP_{in}(t)$ represents a heat capacity flow rate at an inlet of the water tank, and $T_{tank}(t)$ represents a heat storage water temperature and is represented by following Formula without considering the heat dissipation of the water tank:

$$T_{tank}(t) = \frac{\int_0^t V_{in}(t)T_{in}(t)dt}{\int_0^t V_{in}(t)dt},$$

wherein $T_{in}(t)$ represents an inlet temperature of the heat storage water tank at the time t, and $V_{in}(t)$ represents an inlet flow rate of the heat storage water tank at the time t.

10. A simulation method of a dynamic equivalent circuit of a combined heat and power system, comprising:

when an electrical load is $R_e$, a supply voltage of a thermoelectric coupling source is $U_e$;

the heat flows out of a waste heat recovery system of the thermoelectric coupling source; the heat flows through a heating pipeline after a transmission delay time, and a heat loss is generated;

if a first switch and a second switch are all turned on, the heat is completely used for heating of a heat load, and the heat completely flows through the heat load to heat the heat load and then passes through a water return pipeline to reach a water return side; and if the first switch and the second switch are turned off at the same time, part of the heat flows through the heat load to heat the heat load and then passes through the water return pipeline to reach the water return side, and the other part of the heat flows into a heat storage water tank and is stored for later use.

11. The dynamic equivalent circuit of a according to claim 1, wherein the predetermined value set is adjusted according to the obtained test result, wherein the setting of the equivalent inductance, equivalent resistance and equivalent capacitance, the running of the dynamic equivalent circuit and adjusting of the predetermined value set are performed repeatedly until an optimal predetermined value set is obtained, and the combined heat and power system is configured based on the optimal predetermined value set.

* * * * *